United States Patent
Chiang et al.

(10) Patent No.: US 7,545,190 B2
(45) Date of Patent: Jun. 9, 2009

(54) PARALLEL MULTIPLEXING DUTY CYCLE ADJUSTMENT CIRCUIT WITH PROGRAMMABLE RANGE CONTROL

(75) Inventors: Meei-Ling Chiang, Saratoga, CA (US); Sanjeev Maheshwari, San Jose, CA (US); Emerson S. Fang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 38 days.

(21) Appl. No.: 11/742,845

(22) Filed: May 1, 2007

(65) Prior Publication Data

US 2008/0272814 A1    Nov. 6, 2008

(51) Int. Cl.
*H03K 3/017* (2006.01)
(52) U.S. Cl. ........................ 327/175; 327/172
(58) Field of Classification Search ........................ None
See application file for complete search history.

(56) References Cited

U.S. PATENT DOCUMENTS

| | | | |
|---|---|---|---|
| 6,593,789 B2 * | 7/2003 | Atallah et al. | 327/175 |
| 6,806,752 B2 * | 10/2004 | Heyne | 327/175 |
| 6,831,493 B2 * | 12/2004 | Ma | 327/175 |
| 6,933,759 B1 * | 8/2005 | Wu et al. | 327/172 |
| 7,113,053 B2 * | 9/2006 | Yoshikawa | 332/110 |
| 7,180,346 B2 * | 2/2007 | Lee | 327/175 |
| 7,202,722 B2 * | 4/2007 | Mahadevan et al. | 327/175 |

* cited by examiner

*Primary Examiner*—Cassandra Cox
(74) *Attorney, Agent, or Firm*—Zagorin O'Brien Graham LLP

(57) ABSTRACT

A receive interface circuit includes a duty cycle adjustment circuit that adjusts the duty cycle of a reference clock signal based, at least in part, on a selected number of duty cycle adjustment units and a selected range of duty cycle adjustment. The duty cycle adjustment circuit may select as the reference clock signal one of a clock signal and at least a lower version of the clock signal in parallel with the duty cycle adjustment.

21 Claims, 10 Drawing Sheets

PARALLEL MULTIPLEXING DUTY CYCLE ADJUSTMENT CIRCUIT WITH PROGRAMMABLE RANGE CONTROL

BACKGROUND

1. Field of the Invention

This application is related to integrated circuits and more particularly to data communications links between integrated circuits.

2. Description of the Related Art

To properly recover data received by an integrated circuit node transmitted across a data communications link by another integrated circuit node, the receiving node must sample the data during an appropriate phase of the data signal. A transmitting node compliant with an exemplary communications link may transmit, on a separate signal line, a reference clock for use in sampling commands, addresses or data (hereinafter, "data") by the receiving node. However, introduction of skew between received data and a received sample clock (e.g., skew introduced by the channel of the communications link, the receiver, or other sources) may compromise data recovery. For example, if skew between the reference clock and the received data causes data transitions to approach the sampling point, the data transitions may fall within the clock setup time of a sampling device (e.g., flip flop or other state element) causing errors in data recovery. In addition, the phase relationship between the received clock signal and the received data signal may not be stationary, which adds complexity to clock and data recovery operations. Accordingly, techniques for maintaining the integrity of data recovered by a receiving node on a data communications link are desired.

SUMMARY

A receive interface circuit includes a duty cycle adjustment circuit that adjusts the duty cycle of a reference clock signal based, at least in part, on a selected number of duty cycle adjustment units and a selected range of duty cycle adjustment. The duty cycle adjustment circuit may select as the reference clock signal one of a clock signal and at least a lower version of the clock signal in parallel with the duty cycle adjustment.

In at least one embodiment of the invention, an apparatus includes a control signal generation circuit configured to generate at least one control signal based, at least in part, on an indicator of a range of a duty cycle adjustment selected from a plurality of ranges of duty cycle adjustment and an indicator of a number of units of duty cycle adjustment selected from a total number of units of duty cycle adjustment spanning the selected range of duty cycle adjustment. The apparatus includes at least one duty cycle adjustment circuit configured to adjust a duty cycle of a reference clock signal based, at least in part, on the at least one control signal, thereby generating an adjusted version of the reference clock signal.

In at least one embodiment of the invention, a method includes adjusting a duty cycle of a reference clock signal based, at least in part, on an indicator of a range of a duty cycle adjustment selected from a plurality of ranges of duty cycle adjustment and an indicator of a number of units of duty cycle adjustment selected from a total number of units of duty cycle adjustment spanning the selected range of duty cycle adjustment, thereby generating an adjusted version of the reference clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
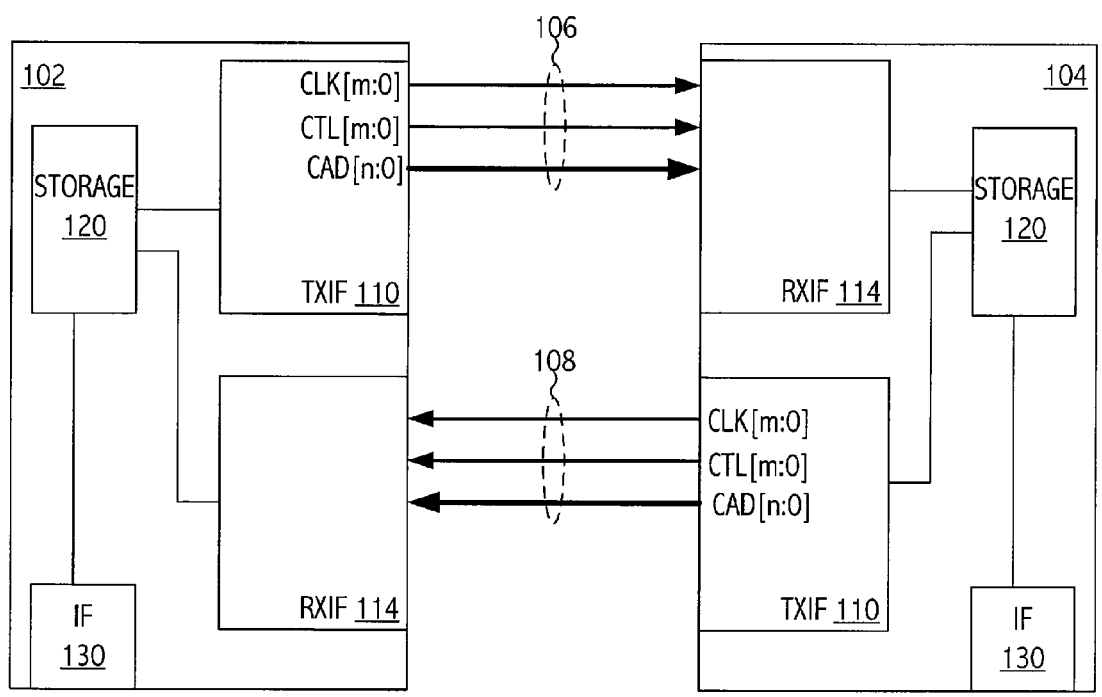
FIG. 1 illustrates a block diagram of two integrated circuit devices coupled by a communications link consistent with one or more embodiments of the present invention.

Referring to FIG. 1, integrated circuit 102 communicates with integrated circuit 104 by an exemplary communications link including transmit interfaces 110, receive interfaces 114, and communications paths 106 and 108, which include respective, individual communications paths for clock signals (e.g., CLK[m:0]), control signals (e.g., CTL[m:0]), and data signals (e.g., n-bits of commands, addresses, or data, i.e., CAD[n:0]). Those individual communications paths may be single-ended or differential communications paths. In at least one embodiment of the communications link, a bit-time is half a clock period in duration, i.e., two data bits (e.g., two CAD[n:0] bits or two CTL[m:0] bits) are transmitted on a corresponding communications path per clock cycle (e.g., a period of a respective one of CLK[m:0]). However, the teachings herein may be adapted for bit-times having one clock period in duration (i.e., one data bit is transmitted on a corresponding communications path per clock cycle) or for other suitable bit-time durations. Communications paths 106 and 108 are unidirectional, i.e., communications paths 106 provides paths from integrated circuit 102 to integrated circuit 104 and communications paths 108 provides paths to integrated circuit 102 from integrated circuit 104. Integrated circuit 102 may include a sideband control mechanism (e.g., interface 130) that provides access to control and/or status registers internal to integrated circuit 102 (e.g., locations in storage circuit 120). Interface 130 may be a Joint Test Action Group (i.e., JTAG) interface, System Management Bus (i.e., SMBus) interface, or other suitable interface. In at least one embodiment, interface 130 communicates test, characterization, and/or diagnostic information between the corresponding integrated circuit and an external processing device (not shown).

Figure 2:
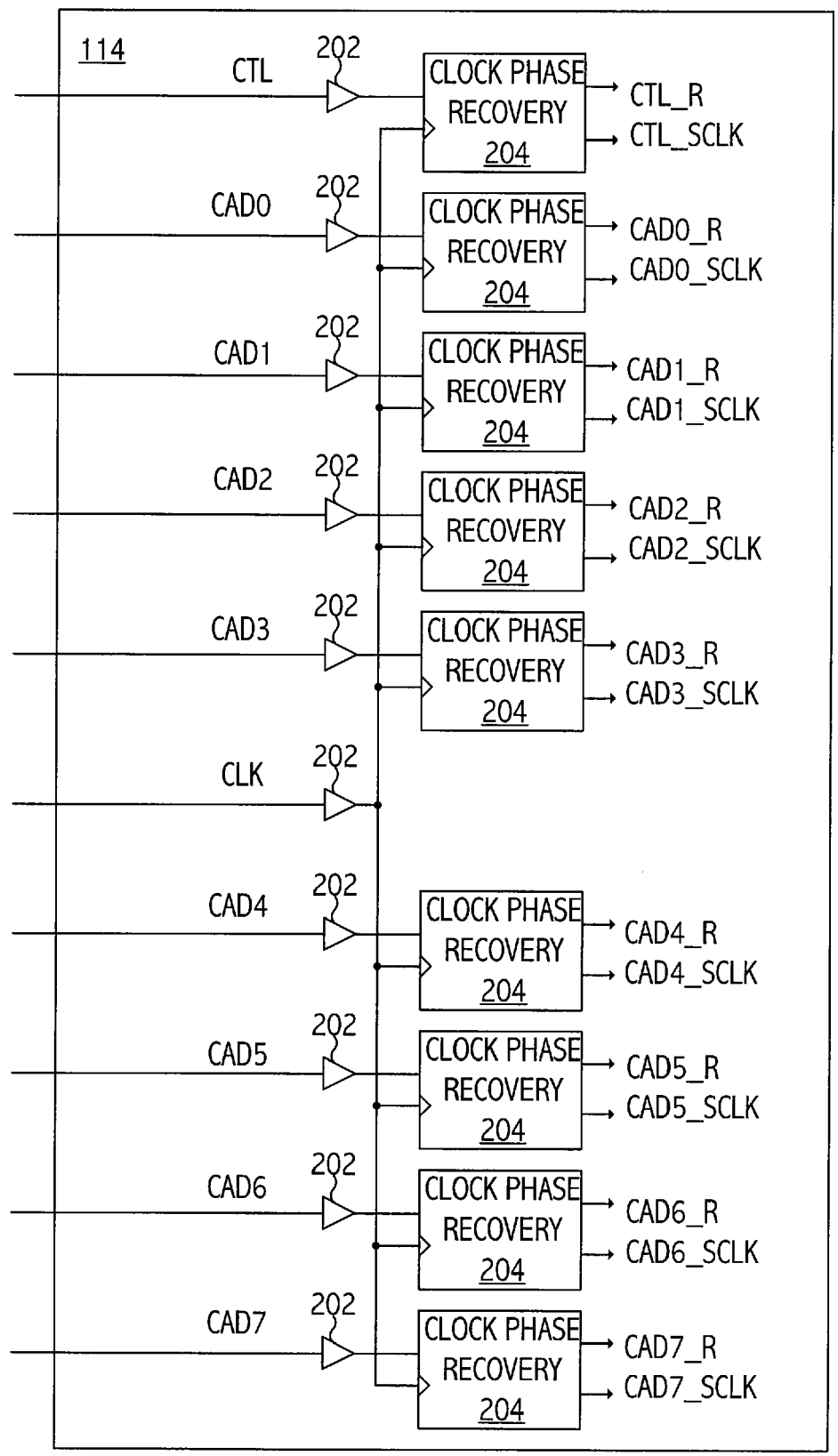
FIG. 2 illustrates a block diagram of a portion of a communications link receive path on an integrated circuit device consistent with one or more embodiments of the present invention.

Referring to FIG. 2, exemplary signals on individual communications paths, CLK, CTL, and CAD[7:0] in integrated circuit 104 are received by individual receivers 202 and individual clock phase recovery circuits 204 in receive interface 114. During data communications operations, receivers 202 may perform signal equalization, signal level shifting, noise reduction, or other appropriate signal processing functions. Exemplary clock phase recovery circuits 204 individually receive a received clock signal (e.g., CLK) in addition to a respective, received data signal (e.g., CTL, CAD0, CAD1, . . . , CAD7). Clock phase recovery circuits 204 generate corresponding sample clocks (e.g., CTL_SCLK, CAD0_SCLK, CAD1_SCLK, . . . , CAD7_SCLK) and provide the recovered data (e.g., CTL_R, CAD1_R, CAD2_R, . . . CAD7_R) to other circuitry of receive interface 114. An individual sample clock signal (e.g., CAD4_SCLK) is a dynamically delayed version of the received clock signal (e.g., CLK), which is dynamically delayed based at least in part on a phase difference between the received clock signal and the corresponding received data signal (e.g., CAD4).

In at least one embodiment of receive interface 114, individual ones of clock phase recovery circuits 204 generate a sample clock signal for sampling the received data signal at the center of a data eye of the received data signal. The phase difference between the received clock signal and the received data signal may be non-stationary, i.e., this phase difference varies during a period of communications link operation. Thus, the delay applied to the received clock signal to generate the sample clock signal is adjusted during the period of communications link operation, accordingly. In at least one embodiment of clock phase recovery circuits 204, the phase difference between the received clock signal and the received data signal at the receiver is less than a particular transport phase difference threshold value (e.g., 3 unit intervals or bit-times). However, in other embodiments of clock phase recovery circuits 204, the phase difference between the sample clock signal and the received data signal may be greater than that particular transport phase difference threshold value.

Figure 3:
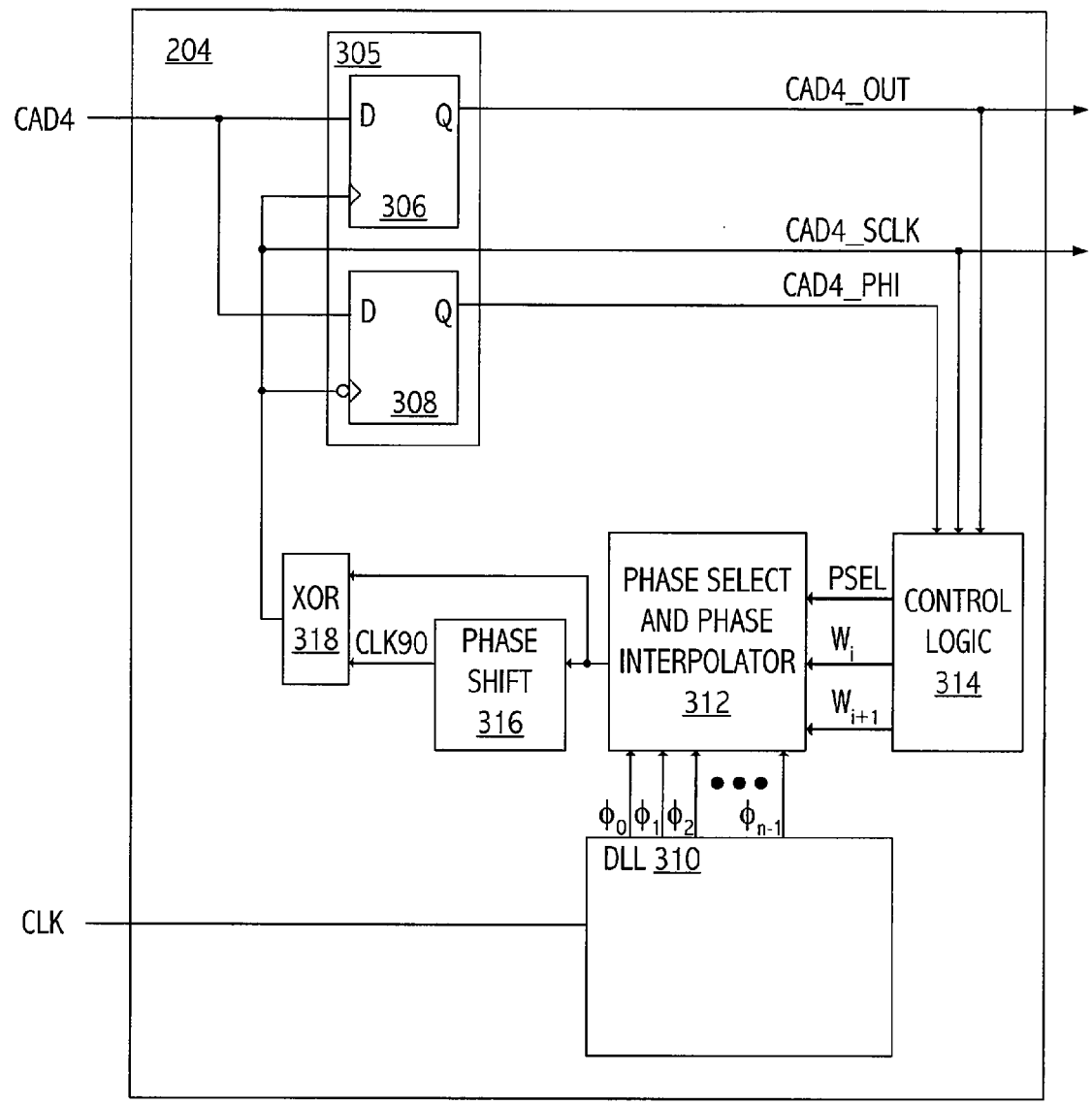
FIG. 3 illustrates a block diagram of an exemplary clock phase recovery circuit consistent with one or more embodiments of the present invention.

Referring to FIG. 3, an exemplary clock phase recovery circuit (e.g., clock phase recovery circuit 204) recovers phase information from the received data signal (e.g., CAD4) and the received clock signal (e.g., CLK) to generate a sample clock signal (e.g., CAD4_SCLK) and a sampled data signal (CAD4_OUT). In at least one embodiment, phase detector 305 includes two flip-flops (e.g., flip-flop 306 and flip-flop 308) that sample the received data signal based on the sample clock signal (e.g., CAD4_SCLK) 180° out of phase with each other. Phase detector 305 provides two signals, a sampled received data signal and a signal providing phase information, e.g., CAD4_OUT and CAD4_PHI, respectively. Those signals are indicative of the phase difference between the received data signal and the received clock signal and are provided to control logic circuit 314.

Figure 6:
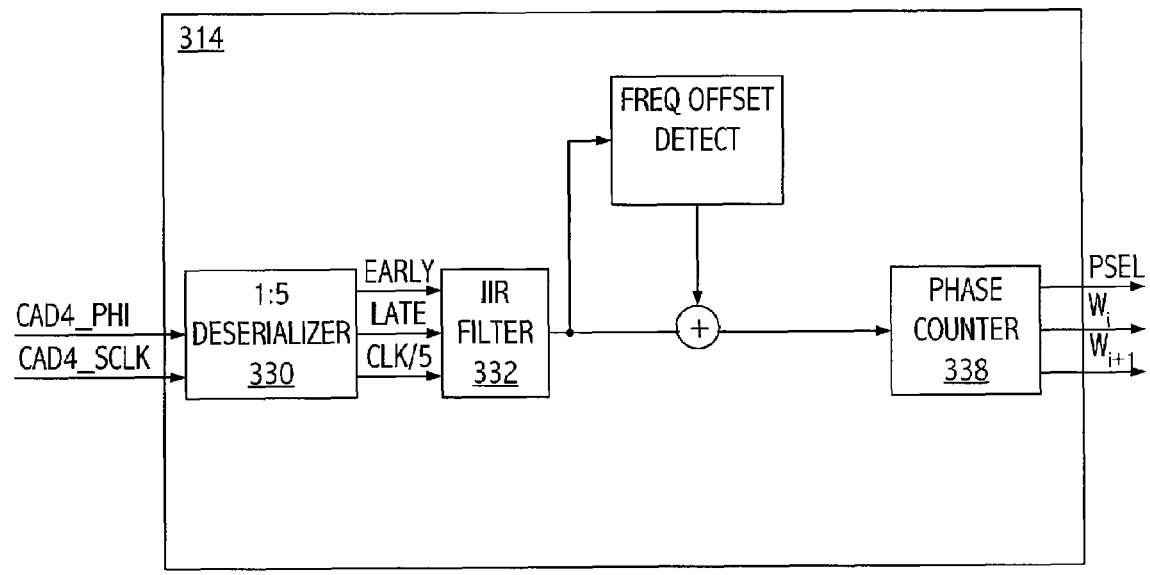
FIG. 6 illustrates a block diagram of an exemplary control logic circuit of a clock phase recovery circuit of FIG. 3 consistent with one or more embodiments of the present invention.

During data communications operations, control logic circuit 314 generates digital control signals (e.g., PSEL, $W_i$, and $W_{i+1}$) for adjusting the sample clock signal based, at least in part, on a comparison of CAD4_OUT to CAD4_PHI. Control logic circuit 314 controls a phase selection and phase interpolation circuit, (e.g., phase select and phase interpolation circuit 312) to generate the sample clock signal having a target phase relationship to the received data signal. For example, control logic circuit 314 may generate control signals PSEL, $W_i$, and $W_{i+1}$ to apply an appropriate delay to the received clock signal to generate the sample clock signal to sample the received data signal in substantially the center of the data eye. Referring to FIG. 6, in an exemplary control logic circuit 314, deserializer circuit 330 determines whether the phase of the sample clock signal is early or late with respect to the received data signal and a phase change request (e.g., phase counter 338 provides appropriate values of PSEL, $W_i$, and $W_{i+1}$) based on this determination. The phase change request applies a delay to shift the phase of the sample clock signal in a direction that aligns the sample clock signal with an appropriate phase of the data. Note that the relationship between phase ($\phi$, in degrees) and delay ($t_D$, in seconds) is $\phi=360\times t_D\times f$ (where frequency, f, is measured in Hz). In at least one embodiment of control logic circuit 314, digital circuitry included in control logic circuit 314 is responsive to a clock derived from the sample clock signal (e.g., CLK/5 generated by deserializer circuit 330). However, other clock signals of suitable frequency may be used by control logic circuit 314.

Figure 4:
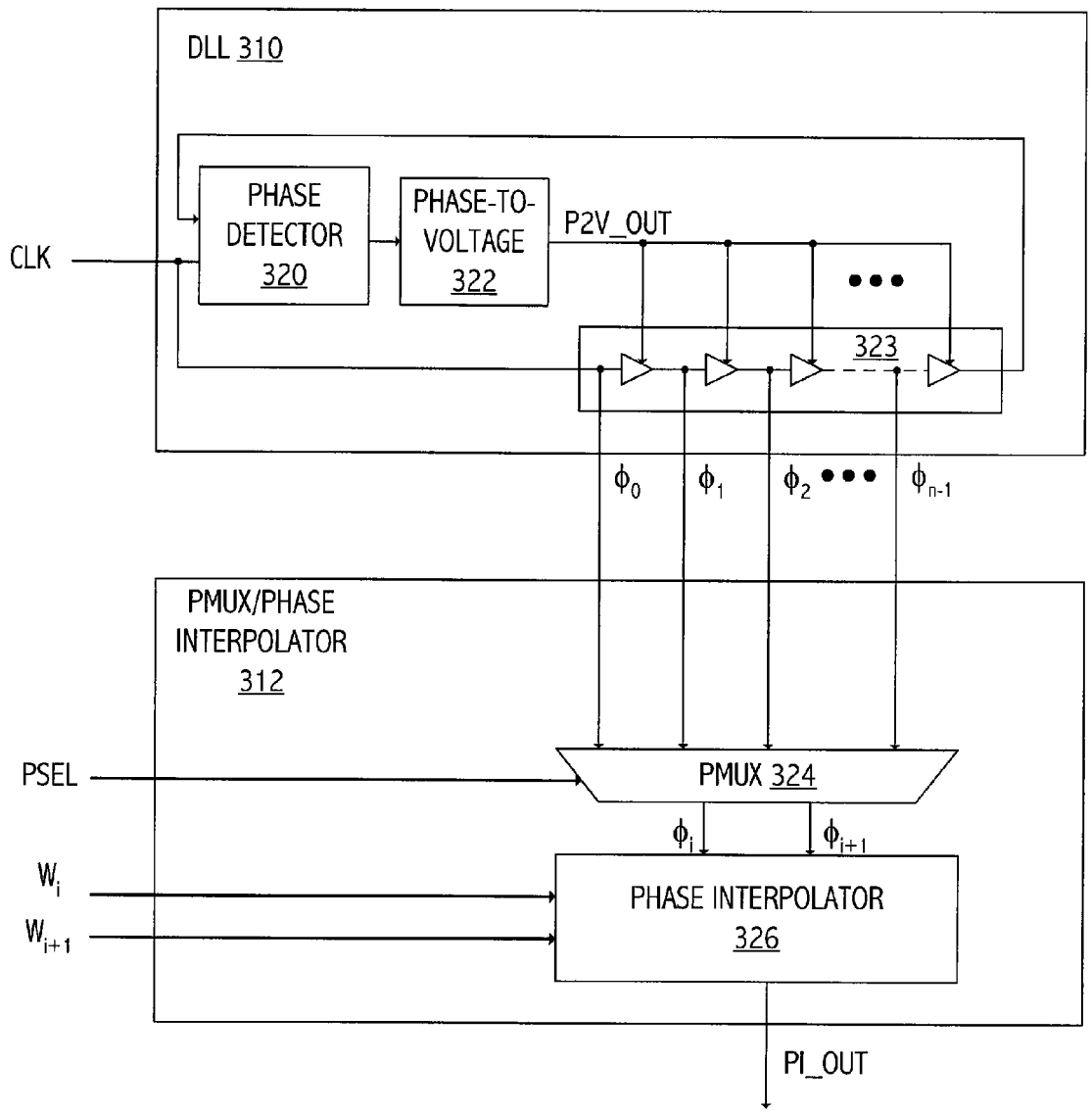
FIG. 4 illustrates a block diagram of an exemplary portion of the clock phase recovery circuit of FIG. 3 consistent with one or more embodiments of the present invention.

Referring back to FIG. 3, in addition to receiving control signals from control logic circuit 314, phase select and phase interpolation circuit 312 receives n phase signals from delay-locked loop (DLL) 310 (e.g., $\phi_0$, $\phi_1$, . . . , $\phi_{n-1}$), which generates these signals based on the received clock signal. Referring to FIG. 4, in at least one embodiment of clock phase recovery circuit 204, DLL 310 includes a delay line (e.g., delay line 323) that is configured to have a total delay equal to the period of the received clock signal. Phase signals $\phi_0$, $\phi_1$, . . . , $\phi_{n-1}$ are spaced evenly to cover the 360° phase space of the received clock signal. Phase signals $\phi_0$, $\phi_1$, $\phi_{n-1}$ may include n/2 true phase signals (e.g., $\phi_0$, $\phi_1$, . . . , $\phi_{n/2-1}$) and corresponding n/2 complementary phase signals (e.g., $\phi_{0B}$, $\phi_{1B}$, . . . , $\phi_{(n/2-1)B}$) in implementations of clock phase recovery circuit 204 that include complementary delay lines in DLL 310, as discussed below.

Delay-locked loop 310 includes a feedback loop including phase detector 320, which may be any suitable phase detector that compares the received clock signal to a delayed version of the received clock signal to generate a phase difference signal. That phase difference is applied to delay line 323. For example, delay line 323 may be a voltage-controlled delay line. The phase difference may be converted by phase-to-voltage circuit 322 into a voltage (e.g., P2V_OUT) that is applied to delay line 323 to adjust the delay of individual delay elements of the delay line to be equivalent and to have a duration that provides a cumulative delay of the delay line equal to the period of the received clock. In at least one embodiment of phase-to-voltage converter circuit 322, the phase-to-voltage conversion is performed by a charge pump. In at least one embodiment of phase detector 320, a binary phase detector or bang-bang type phase detector is used, providing a digital output signal of '1' or '0,' indicating a respective one of an early or late relationship between the received clock signal and the delayed version of the received clock signal. Phase-to-voltage circuit 322 receives the digital output signal and integrates the signal using, e.g., a digital counter that increments in response to an early indication and decrements in response to a late indication. The counter output may be converted into a voltage by a digital-to-analog converter circuit and provided to a smoothing filter to generate an output voltage signal indicating the phase difference.

Although DLL 310 is described above as including a voltage-controlled delay line, in at least one embodiment of DLL 310, delay line 323 is a current-controlled delay line and the phase difference is converted by an appropriate circuit, accordingly. Phase signals $\phi_0, \phi_1, \ldots, \phi_{n-1}$ are versions of the received clock signal delayed by equivalent increments from next adjacent phase signals. Those phase signals may be generated by tapping off nodes of the delay line. In an exemplary DLL 310, DLL 310 locks at the 180° point of the received clock signal, which is a half-rate clock signal (e.g., 2.6 GHz at a 5.2 Gbps data rate) to provide a total delay that is equal to one unit interval or bit-time (e.g., 192 ps for a 2.6 GHz received clock signal).

In an exemplary embodiment of clock phase recovery circuit 204, DLL 310 includes two complementary delay lines driven by complementary versions of the received clock signal. The two complementary delay lines are tapped after each inverter of the delay lines to provide phase-adjacent signals separated by only one inverter delay, thereby improving phase resolution by a factor of two of the individual delay lines. In such an exemplary DLL 310, DLL 310 locks at the 180° point of the received clock signal, which is a half-rate clock signal (e.g., 2.6 GHz at a 5.2 Gbps data rate) to provide a delay of the individual ones of the complementary delay lines that is equal to one unit interval or bit-time (e.g., 192.3 ps for a 2.6 GHz received clock signal). Delay-locked loop 310 outputs true taps from delay line 323 (e.g., $\phi_0, \phi_1, \ldots, \phi_5$), which provide the first 180° of phase signals. In addition, DLL 310 outputs complement taps (e.g., $\phi_{0B}, \phi_{1B}, \ldots, \phi_{5B}$), which provide the second 180° of phase signals. The 12 phase signals cover the 360° of phase with 30° of separation between adjacent phases, each phase signal providing a delay of $(30°/360°) \times (1/2.6 \text{ GHz}) = 32.05$ ps.

Since DLL 310 outputs only discrete values and the phase difference between the received clock signal and the received data signal may not be exactly one of these discrete values, phase select and phase interpolation circuit 312 selects (e.g., according to PSEL) two adjacent phase signals that have phases with respect to the received clock signal that are nearest to the phase difference to be applied to the received clock signal for use in generating the sample clock signal. Those two adjacent phase signals (e.g., $\phi_i$ and $\phi_{i+1}$) are received by phase interpolation circuit 326 and a phase interpolation of the two adjacent phase signals may be performed to generate an interpolated clock signal (e.g., PI_OUT) that is used to generate the sample clock signal. Phase interpolation circuit 326 may be any suitable phase interpolation circuit. Phase interpolator designs are well known in the art and are typically dependent upon the particular DLL implementation and electrical parameters of the interface in which they operate.

The phase difference between the received clock signal and the received data signal may not fall exactly between the selected adjacent phase signals and phase interpolator 326 may not apply an equal weight to each of the adjacent phase signals. Rather, phase interpolator 326 may receive control signals (e.g., weighting signals $W_i$ and $W_{i+1}$) generated by control logic circuit 314 that indicate an appropriate weighting function for application to phase signals $\phi_i$ and $\phi_{i+1}$ to generate the signal having an intermediate phase, e.g., PI_OUT. Accordingly, PI_OUT is an interpolated version of $\phi_i$ and $\phi_{i+1}$ having a particular phase relationship with the received data signal and is used to generate the sample clock signal, which may be phase aligned with the center of the data eye of the received data signal.

In at least one embodiment of phase interpolation circuit 326, weighting signals $W_i$ and $W_{i+1}$ are four bits wide, i.e., each of the phase signals $\phi_i$ and $\phi_{i+1}$ may be weighted by sixteen different values. For example, DLL 310 provides only the exemplary discrete values 0°, 30°, 60°, 90°, 120°, ..., 330° phase shift signals. To obtain a phase shift of 10°, which is between the discrete phase shifts of 0° and 30°, control logic circuit 314 provides a value for $W_i$ that weights $\phi_i$ at ⅔ and a value for $W_{i+1}$ that weights $\phi_{i+1}$ at ⅓ (e.g., 0°×⅔+30°×⅓=10°).

Figure 5:
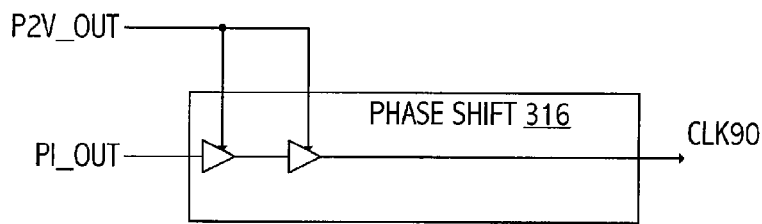
FIG. 5 illustrates a block diagram of an exemplary phase shifting circuit of a clock phase recovery circuit of FIG. 3 consistent with one or more embodiments of the present invention.

Referring back to FIG. 3, the sample clock may be generated by an exclusive-or (e.g., as applied by XOR 318) of the intermediate phase signal (e.g., PI_OUT) with a phase-shifted version of the intermediate phase signal. For example, the intermediate phase signal is a phase-shifted version of the received clock signal and, thus, is a half-rate clock signal (e.g., 2.6 GHz at a 5.2 Gbps data rate). A full-rate clock signal (e.g., 5.2 GHz at a 5.2 Gbps data rate) is generated by exclusive-oring the intermediate phase signal with a version of the intermediate phase signal that is phase shifted by 90°. Referring to FIG. 5, an appropriate phase shift (e.g., a 90° phase shift) is generated by including within exemplary phase shift circuit 316, an appropriate fraction of the number of delay elements in the delay line 323 of DLL 310. The delay elements in phase shift circuit 316 are adjusted by the voltage generated by phase-to-voltage circuit 322 (e.g., P2V_OUT) that is applied to delay line 323 to adjust the delay of individual delay elements of delay line 323 to be equivalent and to have a duration that provides a total delay of the delay line equal to an appropriate period of the received clock signal. In at least one embodiment of the invention, P2V_OUT is applied to phase shift circuit 316 to provide a 90° phase shift. Referring back to FIG. 3, the signal generated by XOR 318 is the sample clock signal that is used to sample the received data signal. One edge of the sample clock signal (i.e., rising or falling edge) is aligned with transitions in the received data signal. The other edge of the sample clock signal is half a unit interval away from the data edge, which is generally in the center of the data eye and is used to sample the received data signal. Note that since transmit clock jitter is present in both the received data signal and the received clock signal, the transmit clock jitter is effectively a common mode phase variation that is rejected by clock phase recovery circuit 204. Accordingly, the transmit clock jitter can be greater than otherwise allowable (e.g., as compared to clock recovery techniques that do not use a forward clock).

In at least one embodiment of the invention, in a low-power mode, neither clock nor data are transmitted by transmit interface 110 on CLK or a corresponding data line. However, since phase and control information in clock phase recovery circuit 204 may be stored in a digital state, clock phase recovery circuit 204 may recover from the low-power mode by maintaining or restoring the digital state from a previously known digital state. Upon resumption of data transmission, the clock phase recovery will be faster than if DLL 310 achieves lock from an initialization state. In another low-power mode, transmit interface 110 may send a clock signal on CLK, but not send data on an individual one of CTL or CAD[n:0]. Delay-locked loop 310 may continue to operate and adjust the delay of the delay line 323. Upon resumption of data transmission, the clock phase recovery will be faster than if DLL 310 achieves lock from a previous state or from an initialization state.

Referring back to FIGS. 1 and 2, in at least one embodiment of receive interfaces 114, each lane of the communications link including transmit interfaces 110, receive interfaces 114, and communications paths 106 and 108 have the same data rate. In another embodiment of the communications link, individual paths of communications paths 106 and 108 may operate at different data rates. Accordingly, a DLL included in the communications link should be capable of locking to reference clock signals having any one of the allowed data rates. For example, each path of communications paths 106 and 108 may operate at one of two data rates (e.g., at the full rate of the reference clock signal or at half the rate of the reference clock signal), independently from the data rate of other paths of communications paths 106 and 108. The DLL included in the communications link is capable of locking to a clock signal having either the frequency of the full rate reference clock signal or having a frequency of approximately half the frequency of the reference clock signal.

In at least one embodiment of receive interface 114, a clock distribution network and/or other source(s) may introduce duty cycle distortion into the clock signal input to DLL 310. For example, if the clock signal is routed over a relatively large distance and inverters are used as clock buffers, difficulties in matching clock buffers to cancel differences in rise delays and fall delays may result in duty cycle distortion. As a result of duty cycle distortion of the DLL clock signal input away from, e.g., a 50% duty cycle, the DLL may lock to something other than a bit-time (i.e., the delay line may have a cumulative delay that is not equal to a bit-time), phase signal outputs of the DLL, $\phi_0, \phi_1, \ldots, \phi_{n-1}$, will not correspond to 360° of phase, thus, introducing a phase discontinuity between 360° and 0°. For example, when DLL 310 is configured to lock to a 180° point of the received clock signal, phase detector 320 may be configured to use the rising edge of CLK as the 0° point and the falling edge of CLK as the 180° point. If the duty cycle of CLK is 50%, DLL 310 will actually lock to the 180° point of the received clock signal. However, deviation from a 50% duty cycle results in the actual phase separation between adjacent phase signals being other than a target 30° (i.e., 32.05 ps delay between adjacent phase signals for a 2.6 GHz clock signal), as described above. If CLK actually has a 33.3% duty cycle, instead of the target 50% duty cycle, the falling edge of CLK corresponds to the 120° point, instead of the target 180° point. Six phase signals equally spaced across 120° of CLK (i.e., 20° per phase signal) correspond to twelve phase signals spanning only 240°, resulting in a discontinuity between 240° and 360°. Accordingly, a sample clock signal generated from the receive clock signal may not sample the data at the appropriate time, therefore compromising the integrity of data recovery by receive interface 114.

Figure 7:
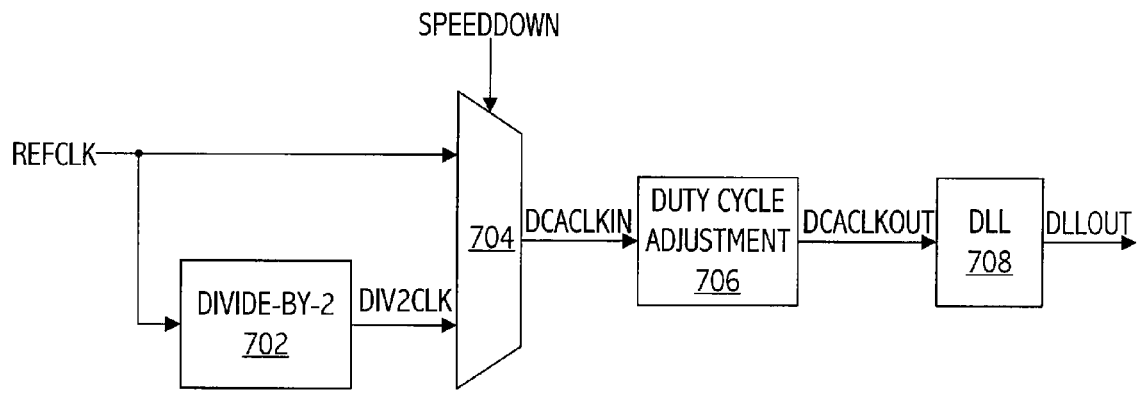
FIG. 7 illustrates a block diagram of an exemplary DLL and duty cycle adjustment circuit.

Referring to FIG. 7, in at least one embodiment of receive interface 114, the frequency of the reference clock signal is divided (e.g., divided by two by divider circuit 702) to generate a lower frequency version of the reference clock signal (e.g., DIV2CLK), consistent with a lower-speed mode of receive interface 114. A select circuit (e.g., select circuit 704) provides at its output (e.g., DCACLKIN), a selected one of the reference clock signal and the lower speed clock signal according to a mode of operation of the receive interface (e.g., the mode of operation indicated by SPEEDDOWN).

Figure 8:
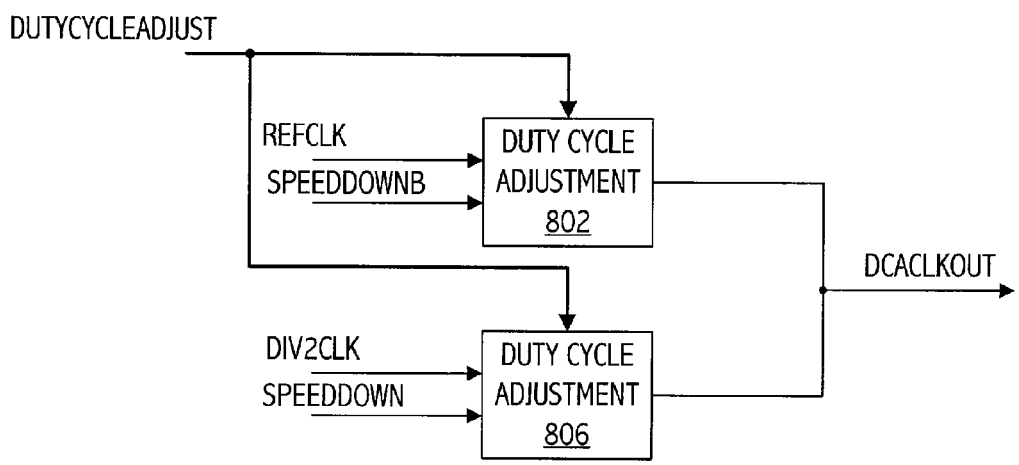
FIG. 8 illustrates a block diagram of an exemplary DLL and duty cycle adjustment circuit consistent with one or more embodiments of the present invention.

In at least one embodiment of receive interface 114, to reduce effects of duty cycle distortion, duty cycle adjustment circuit 706 adjusts the duty cycle of the clock signal supplied to DLL 708. However, select circuit 704 and duty cycle adjustment circuit 706 increase the insertion delay (i.e., the total delay between REFCLK and DLLOUT, when the DLL is set to its fastest setting). In at least one embodiment of receive interface 114, the functions of selecting the input to DLL 708 and adjusting the duty cycle of the input to DLL 708 are implemented in parallel, rather than in series. Referring to FIG. 8, a parallel implementation of the select and duty cycle adjustment functions includes a separate duty cycle adjustment circuit for each version of the reference clock signal, e.g., duty cycle adjustment circuit 802 for the full-rate REFCLK and duty cycle adjustment circuit 806 for the lower speed DIV2CLK. The selecting function is implemented by allowing only one of the duty cycle adjustment circuits to drive the input to DLL 708 (e.g., DCACLKOUT) according to a selected mode of operation (e.g., the mode indicated by complementary signals SPEEDDOWN and SPEEDDOWNB). Note that the techniques described herein may be applied to additional versions of the reference clock signal and corresponding duty cycle adjustment circuits.

Referring to FIGS. 9-12, in at least one embodiment of receive interface 114, nominal receiver specifications are satisfied when the duty cycle adjustment has a minimum range (e.g., 5% of the clock period) and having a maximum unit size (i.e., resolution, e.g., 1% of the clock period), where a total number of units of duty cycle adjustment span the range of duty cycle adjustment. However, to satisfy the receiver specifications when process and speed vary from nominal values, selectively adjusted range control may be applied to the voltage offset, which changes the range of the duty cycle adjustment. For example, when process variations result in manufacture of systems that generate signals having a slow operating range as compared to the nominal operating range, the duty cycle adjustment per unit increases from a target value. Accordingly, a smaller range of voltage offset is selected (e.g., a voltage offset range of approximately 0.20V, reduced from approximately 0.40V), which decreases the range of the duty cycle adjustment, thereby achieving a target resolution (e.g., a duty cycle adjustment per unit of 1% of the clock period). Similarly, when process variations result in manufacture of a system that generate signals having a fast operating range as compared to the nominal operating range, duty cycle adjustment per unit decreases from a target value. Accordingly, a wider range of voltage offset is selected, which increases the range of the duty cycle adjustment, thereby achieving a target duty cycle adjustment range (e.g., 5% of the clock period). Thus, the sensitivity of the range and resolution of a duty cycle adjustment to process variations is substantially reduced or eliminated.

Figure 9:
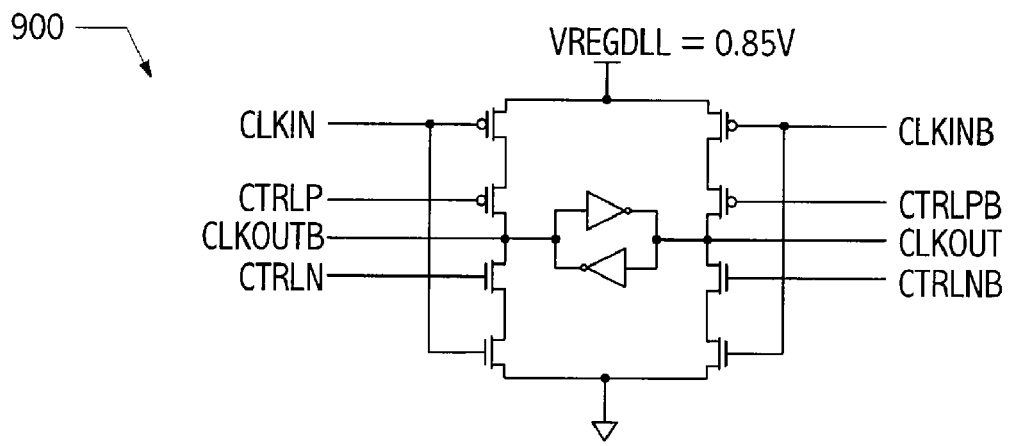
FIG. 9 illustrates a block diagram of an exemplary portion of the DLL and duty cycle adjustment circuit of FIG. 8 consistent with one or more embodiments of the present invention.

Referring to FIG. 9, exemplary duty cycle adjustment circuit 900 generates a duty cycle adjustment by varying the pull-up and pull-down strengths of an inverter circuit based on analog control voltages. For example, when CTRLN and CTRLP increase, the pull-down strength of circuit 900 is increased and the pull-up strength of circuit 900 is decreased, which decreases the fall time CLKOUT and increases the rise time of CLKOUT, thereby reducing the duty cycle of CLKOUT. The range of the duty cycle adjustment may be controlled by adjusting the range of control voltages on CTRLN, CTRLNB, CTRLP, and CTRLPB.

Figure 10A:
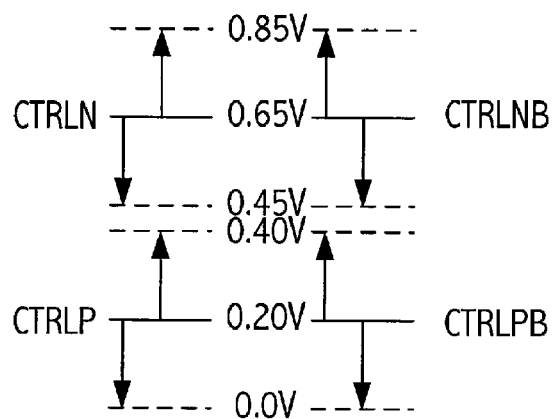
FIGS. 10A and 10B illustrate exemplary control signals associated with the DLL and duty cycle adjustment circuit of FIG. 9 consistent with one or more embodiments of the present invention.
Figure 10B:
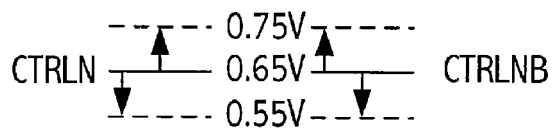
Figure 10B:
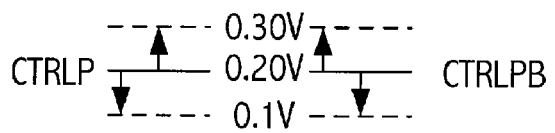

Referring to FIG. 10A control voltages CTRLN and CTRLNB vary over a voltage range defined by a first voltage offset (e.g., approximately 0.20V) from a first voltage (e.g., approximately 0.65V) and control voltages CTRLP and CTRLPB vary over a voltage range defined by the first voltage offset from a second voltage (e.g., approximately 0.20V) to increase or decrease the strength of the inverter circuit from the strength when respective ones of the control voltages are approximately 0.65V and approximately 0.20V. A decreased range of voltage offset (FIG. 10B) may provide a total number of duty cycle adjustment units (e.g., 32 units) over a smaller range (e.g., approximately 0.20V, reduced from approximately 0.40V), thereby satisfying resolution specifications of the duty cycle adjustment, e.g., when the process results in circuits that operate faster than nominal speed. Control voltages CTRLN and CTRLNB vary over a voltage range defined by a second voltage offset (e.g., approximately 0.10V) from the first voltage (e.g., approximately 0.65V) and control voltages CTRLP and CTRLPB vary over a voltage range defined by the second voltage offset from the second voltage (e.g., approximately 0.20V) to increase or decrease the strength of the inverter circuit from the strength when respective ones of the control voltages are 0.65V and 0.20V. Note that CTRLNB and CTRLPB are adjusted in the same direction and CTRLN and CTRLP are adjusted in the same direction, as indicated by the arrows in FIGS. 10A and 10B.

Figure 11:
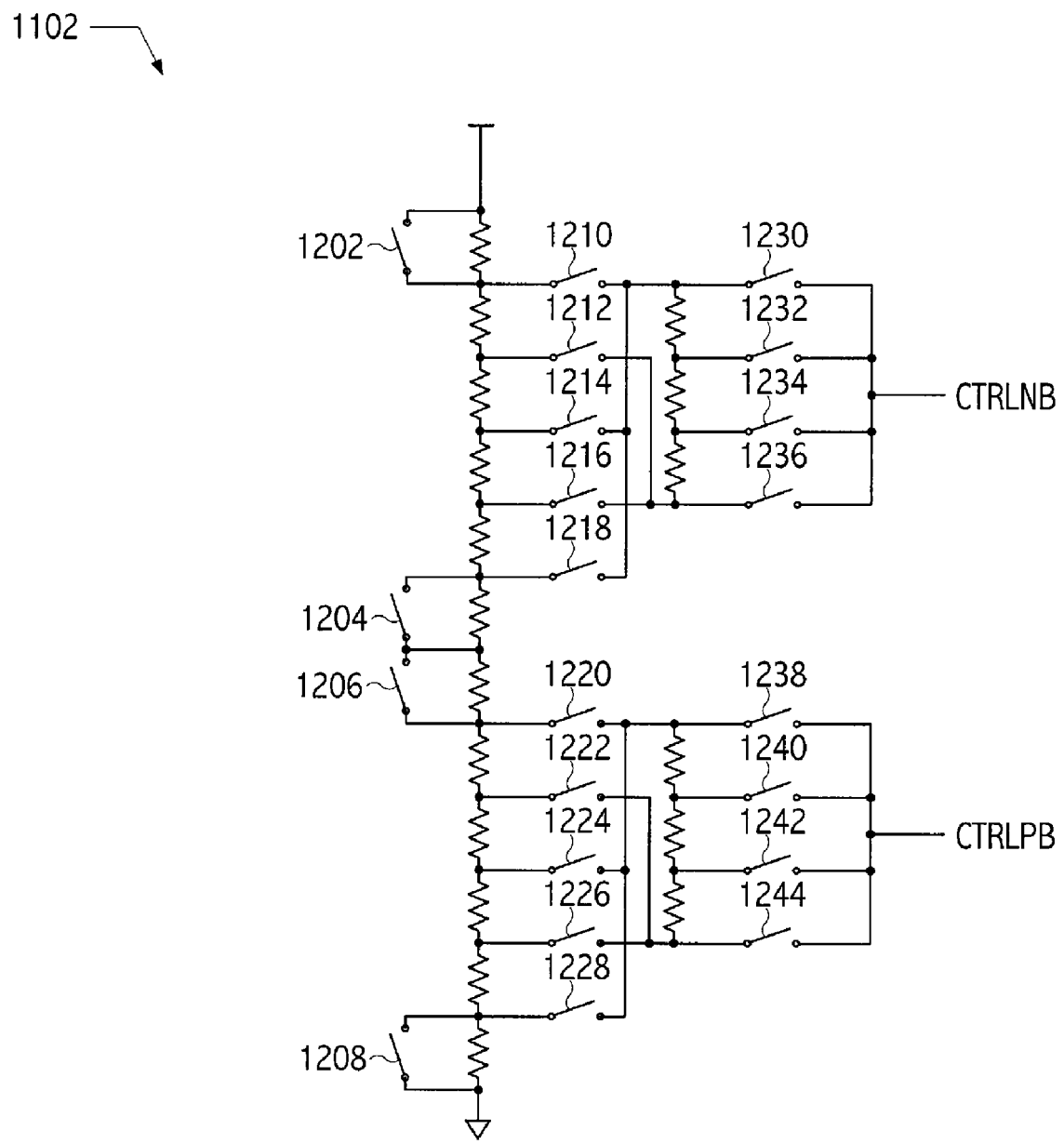
FIG. 11 illustrates a block diagram of an exemplary portion of the DLL and duty cycle adjustment circuit of FIG. 8 consistent with one or more embodiments of the present invention.

Referring to FIG. 11, control voltages CTRLN, CTRLNB, CTRLP, and CTRLPB are generated by a control circuit, e.g., digital-to-analog converter circuit 1102 (i.e., DAC 1102) based on digital signals indicating a range and number of adjustment units (e.g., RANGECTRLCODE and DUTYADJCODE, respectively). In at least one embodiment of receive interface 114, DAC 1102 includes a resistor divider network, e.g., a two-stage resistor DAC that generates two differential output signals based on input digital codes. However, other suitable control signal generation circuits may be used. DAC 1102 includes range control switches 1202, 1204, ... ,1208, coarse tune switches 1210, 1212, ... ,1228, and fine tune switches 1230, 1232, ... ,1244. Although only five pairs of coarse tune switches and four pairs of fine tune switches are illustrated, in at least one embodiment, DAC 1102 uses other numbers of coarse and fine tune switches to realize, e.g., thirty-two levels for each of CTRLNB and CTRLPB. In at least one embodiment of DAC 1102, if the range control code indicates a wide range, then switches 1202, 1204, ..., 1208 are closed and the duty cycle adjust control signals CTRLN, CTRLNB, CTRLP, and CTRLPB vary over a wider range (e.g., the range illustrated in FIG. 10A) and if the range control code indicates a narrow range, then switches 1202, 1204, ..., 1208 are open and the duty cycle adjust control signals CTRLN, CTRLNB, CTRLP, and CTRLPB vary over a narrower range (e.g., the range illustrated in FIG. 10B).

In at least one embodiment of DAC 1102, switches 1210, 1212, ..., and 1218 correspond to a coarse voltage of CTRLNB and are selectively closed based on the most-significant bits of a duty cycle adjust code. A selected one of the coarse voltage switches is closed only when an adjacent switch is also closed, i.e., two adjacent coarse voltage switches are closed at a time. Thus, in exemplary DAC 1102, only four combinations of closed coarse voltage switches are legal, based on the two most-significant bits of a four-bit duty cycle adjust code. A duty cycle adjust code is used to control switches 1220, 1222, ..., and 1228 in a similar manner. The lower four bits of duty cycle adjust code 1309 are used to selectively close the fine voltage switches 1230, 1232, 1234, and 1236. Only a selected one of the fine voltage switches is closed at a time. The duty cycle adjust code is used to control switches 1238, 1240, 1242, and 1244 in a similar manner. Control signals CTLN and CTRLP may be generated using a second DAC circuit (not shown) similar to DAC 1102, using a corresponding duty cycle adjust code. In at least one embodiment, the second DAC circuit shares at least some of the range control resistors and switches of DAC 1102, as well as the coarse voltage resistors and switches of DAC 1102, while all of the fine voltage switches and resistors are duplicated.

Figure 12:
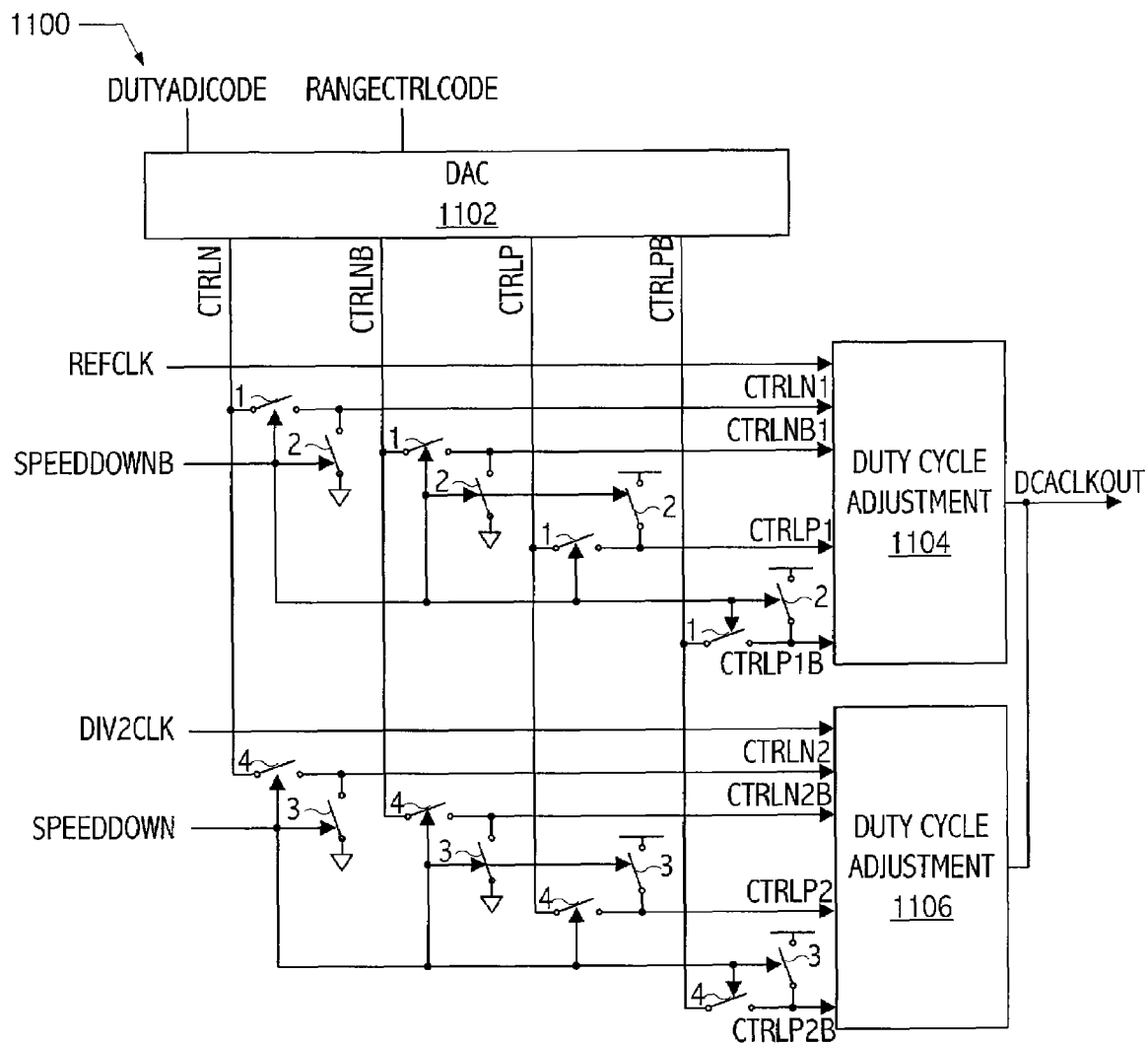
FIG. 12 illustrates a circuit diagram of an exemplary portion of the DLL and duty cycle adjustment circuit of FIG. 8 consistent with one or more embodiments of the present invention.

Referring to FIG. 12, the function of selecting one of the two duty cycle adjustment circuits to drive the input to DLL 310 (e.g., DCACLKOUT) according to a selected mode of operation (e.g., the mode indicated by SPEEDDOWN and SPEEDDOWNB) may be implemented using switches that selectively couple the duty cycle adjustment control signals (e.g., CTRLN, CTRLNB, CTRLP, CTRLPB) to duty cycle adjustment circuits 802 and 804. In at least one embodiment of receive interface 114, if the speed-down mode is enabled (i.e., SPEEDDOWN='1' and SPEEDDOWNB='0'), switches 1 are effectively open, switches 2 are effectively closed, switches 4 are effectively closed, and switches 3 are effectively open and CTRLN, CTRLNB, CTRLP, and CTRLPB will be passed to duty cycle adjustment circuit 1106 (e.g., on CTRLN2, CTRLNB2, CTRLP2, and CTRLPB2, respectively). Meanwhile, the CTRLN1 and CTRLNB1 inputs to duty cycle adjustment circuit 1104 will be coupled to a ground voltage, and the CTRLP1 and CTRLPB1 inputs to duty cycle adjustment circuit 1104 will be coupled to a power supply node. Accordingly, the output node of duty cycle adjustment circuit 1104 has an effectively, high-impedance state, permitting duty cycle adjustment circuit 1106 to drive the signal on DCACLKOUT.

Similarly, when speed-down mode is disabled, i.e., SPEEDDOWN='0' and SPEEDDOWNB='1'), switches 1 are effectively closed, switches 2 are effectively open, switches 4 are effectively open, and switches 3 are effectively closed, and CTRLN, CTRLNB, CTRLP, and CTRLPB will be passed to duty cycle adjustment circuit 1104 (e.g., on CTRLN1, CTRLNB1, CTRLP1, and CTRLPB1, respectively). Meanwhile, the CTRLN2 and CTRLNB2 inputs to duty cycle adjustment circuit 1106 will be coupled to a ground voltage, and the CTRLP2 and CTRLPB2 inputs to duty cycle adjustment circuit 1106 will be coupled to a power supply node. Accordingly, the output node of duty cycle adjustment circuit 1106 has an effectively, high-impedance state, permitting duty cycle adjustment circuit 1104 to drive the signal on DCACLKOUT.

Figure 13:
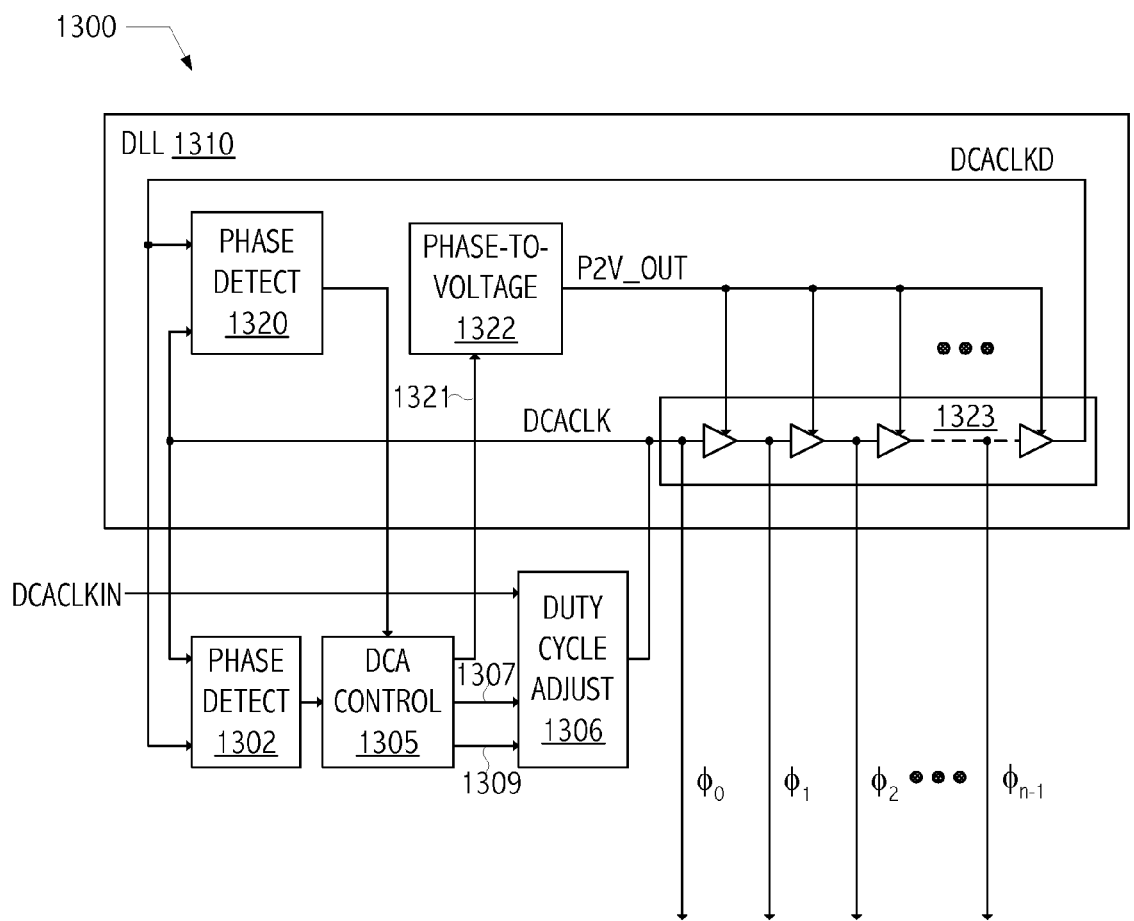
FIG. 13 illustrates a block diagram of an exemplary portion of the clock phase recovery circuit of FIG. 3, consistent with one or more embodiments of the present invention.

Referring to FIG. 13, DLL and duty cycle adjust circuit 1300 includes phase detector circuits 1302 and 1320, which generate phase information based on the adjusted clock signal (e.g., DCACLK) and the delayed adjusted clock signal (e.g., DCACLKD). In at least one embodiment, phase detector circuits 1302 and 1320 are binary phase detectors or bang-bang type phase detectors that provide a digital output signal of '1' or '0,' indicating whether one of the signals is early or late, respectively, with respect to the other of the signals. Phase detector circuits 1302 and 1320 compare different edges of a DLL reference clock signal (e.g., DCACLK) and a delayed version of the reference clock signal (e.g., DCACLKD). For example, phase detector 1320 compares falling edges of DCACLK to rising edges of DCACLKD, and phase detector 1302 compares rising edges of DCACLK to falling edges of DCACLKD. The outputs of phase detectors 1302 and 1320 can be used to determine when the DLL reference clock signal has a 50% duty cycle based on a 50% duty cycle resulting in falling edges of DCACLK being aligned to the rising edges of DCACLKD and the rising edges of DCACLK being aligned to the falling edges of DCACLKD. Accordingly, control circuit 1305 uses the outputs of phase detectors 1302 and 1320 to determine duty cycle adjustment control signals. Note that phase detector circuit 1320 is shared between the circuits for adjusting delay line 1323 and the circuits included for determining a duty cycle adjustment. However, in other embodiments of DLL and duty cycle adjust circuit 1300, a separate phase detector circuit may be used instead, and control circuitry included in control circuit 1305 for controlling phase-to-voltage 1322 may be included in phase-to-voltage 1322 itself In at least one embodiment of DLL and duty cycle adjust circuit 1300, control circuit 1305 includes a first counter (e.g., an 11-bit counter) that is used to control a fine delay adjustment of delay line 1323. The first counter decrements in response to an early indication from phase detector 1320 and increments in response to a late indication. The count value resulting after a predetermined period of time is used to determine a DLL digital control value (e.g., a value of digital control signal 1321) used by phase-to-voltage circuit 1322 to generate a voltage (e.g., P2V_OUT). That voltage is applied to delay line 323 to adjust the delay of individual delay elements of the delay line to be equivalent and to have a duration that provides a cumulative delay of the delay line equal to the period of the received clock. In at least one embodiment of DLL and duty cycle adjust circuit 1300, the first counter circuit is initialized to a maximum value (e.g., 2047) and is decremented for each indication of one of early or late from phase detector 1320 and is incremented for each indication of the other of early or late from phase detector 1320 over the predetermined period (e.g., 2048 cycles). Control circuit 1305 adjusts digital control signal 1321 to achieve a particular count value indicative of DLL 1310 achieving lock (e.g., approximately 1024).

In at least one embodiment of DLL and duty cycle adjust circuit 1300, a second counter is used to control a coarse delay adjustment of delay line 1323, as well as the range of the duty cycle adjustment circuit. The value of the second counter may be used as an offset to the first counter to determine how fast or slow the DLL should run. Then the first counter is reset and DLL and duty cycle adjustment circuit continues to achieve lock. The second counter increments each time the first counter achieves the maximum value and decrements each time the first counter achieves the minimum value. While DLL 1310 achieves lock, control circuit 1305 determines, based on the first counter value over the predetermined period, whether process variations have resulted in a DLL that generates a clock signal having a fast or slow operating range as compared to a nominal operating range. Accordingly, control circuit 1305 determines a range of the duty cycle adjustment and generates a digital code (e.g., digital range code 1307) indicative thereof, e.g., using a control loop which adjusts the digital range code 1307 based on the values of the first and second counters. For example, if the first counter achieves the minimum value many times, causing the second counter to achieve a low count value, the low count value is used as an indicator that the process has resulted in circuits that operate faster than nominal operating speeds. As a result, a wider duty cycle adjustment range is chosen. If the first counter achieve the maximum value many times, causing the second counter to achieve a high count value, the high count value is used as an indicator that the process has resulted in circuits that operate slower than nominal operating speeds. As a result, a narrower duty cycle adjustment range is chosen to achieve a target duty cycle adjustment resolution. In at least one embodiment of DLL and duty cycle adjust circuit 1300, the range control code is one-bit, indicating a selected one of two possible ranges, as described above with reference to DAC 1102 of FIG. 11. However, techniques described herein may apply to any number of selectable ranges.

Referring back to FIG. 13, control circuit 1305 also generates a digital code indicating a number of units (e.g., duty cycle adjust code 1309) that the duty cycle should be adjusted. A third counter (e.g., a 5-bit counter) is initialized to a mid-range value (e.g., 16). The counter increments, for example, for each indication of early from the phase detector 1302 and is decremented for each indication of late from the phase detector 1302 over a predetermined period. At the end of the predetermined period, if the counter has the mid-range value, then no duty cycle adjustment is introduced to DCACLKIN and the duty cycle of DCACLK is substantially equal to the duty cycle of DCACLKIN. If the counter value is greater than the mid-range value, the duty cycle is increased. If the counter value is less than the mid-range value, the duty cycle is decreased by a number of units. Duty cycle adjust code 1309 indicates the number of units of duty cycle adjustment, based on the amount by which the count value exceeds or is below the mid-range counter value.

A lock condition of the duty cycle adjustment loop may be detected from the first counter in the phase-to-adjust circuit, e.g., when the counter saturates to a maximum value at one setting and at an adjacent setting, the counter saturates to a minimum value or from the output of phase detector 1302, e.g., when the output of phase detector 1302 toggles between early and late. In at least one embodiment of receive interface 114, the duty cycle adjustment loop is always enabled during steady-state operation, which may introduce a jitter component to the sample clock signal but reduce duty cycle drift over time due to environmental conditions. In at least one embodiment of receive interface 114, the duty cycle adjustment loop is effectively disabled after achieving lock, which may reduce additional jitter on the sample clock signal, but may result in duty cycle drift over time due to environmental conditions.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which the received data signals have bit-times of half the received clock period in duration, one of skill in the art will appreciate that the teachings herein can be utilized with received data signals having other bit-times. Variations and modifications of the embodiments disclosed herein, may be made based on the description set forth herein, without departing from the scope and spirit of the invention as set forth in the following claims.

What is claimed is:

1. An apparatus comprising:
   a control signal generation circuit configured to generate at least one control signal based, at least in part, on an indicator of a range of a duty cycle adjustment selected from a plurality of ranges of duty cycle adjustment and an indicator of a number of units of duty cycle adjustment selected from a total number of units of duty cycle adjustment spanning the selected range of duty cycle adjustment; and at least one duty cycle adjustment circuit configured to adjust a duty cycle of a reference clock signal based, at least in part, on the at least one control signal, thereby generating an adjusted version of the reference clock signal.

2. The apparatus, as recited in claim 1, wherein the at least one control signal has a voltage level that varies from a first voltage within a range defined by a voltage offset selected from at least a first voltage offset and a second voltage offset, thereby indicating a duty cycle adjustment within the selected range of duty cycle adjustment.

3. The apparatus, as recited in claim 2, wherein the first voltage offset is greater than the second voltage offset and the first voltage plus the first voltage offset equals approximately a power supply voltage and the first voltage is greater than half the power supply voltage.

4. The apparatus, as recited in claim 2, wherein the first voltage offset is greater than the second voltage offset and the first voltage minus the first voltage offset equals approximately a ground voltage and the first voltage is less than half a power supply voltage.

5. The apparatus, as recited in claim 1, wherein the at least one control signal indicates a magnitude and sign of the duty cycle adjustment.

6. The apparatus, as recited in claim 1, wherein the at least one duty cycle adjustment circuit comprises an inverter circuit having an adjustable rise time and an adjustable fall time, the rise time and fall time being adjusted based, at least in part, on the at least one control signal.

7. The apparatus, as recited in claim 1, wherein the at least one duty cycle adjustment circuit comprises an inverter circuit having an adjustable pull-up strength and an adjustable pull-down strength, the pull-up strength and pull-down strength being adjusted based, at least in part, on the at least one control signal.

8. The apparatus, as recited in claim 1, wherein the at least one duty cycle adjustment circuit comprises a tri-state inverter circuit.

9. The apparatus, as recited in claim 1, wherein the at least one duty cycle adjustment circuit comprises a plurality of duty cycle adjustment circuits responsive to respective ones of a plurality of clock signals and the apparatus further comprises:

a plurality of selector circuits coupled between the control signal generation circuit and respective ones of the plurality of duty cycle adjustment circuits, respective selector circuits selectively providing a corresponding one of the at least one control signal to a respective duty cycle adjustment circuit based, at least in part, on a select signal indicating a selected one of a plurality of clock signals having different frequencies.

10. The apparatus, as recited in claim 9, wherein the plurality of selector circuits are configured to selectively configure a respective duty cycle adjustment circuit in a high-impedance state in response to an indicator of a selected clock signal being other than the respective clock signal.

11. The apparatus, as recited in claim 1, further comprising:

a control circuit configured to generate the indicator of the range of the duty cycle adjustment and the indicator of the number of units of duty cycle adjustment based, at least in part, on a difference between an output of a rising-edge phase detector and an output of a falling-edge phase detector, the rising-edge and falling-edge phase detectors each being responsive to the adjusted reference clock signal and a delayed version of the adjusted reference clock signal.

12. The apparatus, as recited in claim 1, wherein the control signal generation circuit comprises a digital-to-analog converter circuit comprising:

a first resistor divider responsive to the indicator of a range of the duty cycle adjustment and the indicator of the number of units of duty cycle adjustment; and a second resistor divider coupled in parallel to at least a portion of the first resistor divider, the second resistor divider being responsive to the indicator of the number of units of duty cycle adjustment.

13. The apparatus, as recited in claim 1, further comprising:

a delay-locked loop circuit responsive to the adjusted reference clock signal to provide a plurality of phase clock signals having respective phases spaced equally across at least a predetermined fraction of the period of the adjusted reference clock signal.

14. A method comprising:

adjusting a duty cycle of a reference clock signal based, at least in part, on an indicator of a range of a duty cycle adjustment selected from a plurality of ranges of duty cycle adjustment and an indicator of a number of units of duty cycle adjustment selected from a total number of units of duty cycle adjustment spanning the selected range of duty cycle adjustment, thereby generating an adjusted version of the reference clock signal, wherein the adjusting comprises varying the rise and fall tine of an inverter circuit based, at least in part, on the indicator of the selected rang of the duty cycle adjustment and the indicator of the selected number of units of duty cycle adjustment, the inverter circuit being configured to generate the adjusted version of the reference clock signal based, at least in part, on the reference clock signal.

15. The method, as recited in claim 14, wherein the varying comprises:

varying a pull-up strength and a pull-down strength of the inverter circuit based, at least in part, on the indicator of the selected range of the duty cycle adjustment and the indicator of the selected number of units of duty cycle adjustment, the inverter circuit being configured to generate the adjusted version of the reference clock signal based, at least in part, on the reference clock signal.

16. The method, as recited in claim 14, further comprising:

selecting the selected range of the duty cycle adjustment from the plurality of ranges of duty cycle adjustment, and generating the indicator thereof, based at least in part, on the adjusted reference clock signal and a delayed version of the adjusted reference clock signal; and selecting the selected number of units of the duty cycle adjustment from the total number of units of duty cycle adjustment, and generating the indicator thereof, based at least in part, on the adjusted reference clock signal and a delayed version of the adjusted reference clock signal.

17. The method, as recited in claim 14, further comprising:

selecting the reference clock signal from a plurality of clock signals having different frequencies.

18. The method, as recited in claim 14, further comprising:

generating a sample clock signal on a first integrated circuit based at least in part on a phase difference between the adjusted reference clock signal and a data signal, wherein the adjusted reference clock signal is based on a received clock signal received from a second integrated circuit, and the data signal is based on a received data signal received from the second integrated circuit separately from the received clock signal.

19. An apparatus comprising:

means for generating an indicator of a range of a duty cycle adjustment selected from a plurality of ranges of duty cycle adjustment and an indicator of a number of units of duty cycle adjustment selected from a total number of units of duty cycle adjustment spanning the selected range of duty cycle adjustment; and means for adjusting a duty cycle of a reference clock signal based, at least in part, on the indicator of the range of the duty cycle adjustment and the indicator of the number of units of duty cycle adjustment, thereby generating an adjusted version of the reference clock signal.

20. The apparatus, as recited in claim 19, further comprising:

means for selecting the reference clock signal from a plurality of clock signals having different frequencies.

21. The apparatus, as recited in claim 19, further comprising:

means for generating a sample clock signal on a first integrated circuit based at least in part on a phase difference between the adjusted reference clock signal and a data signal, wherein the adjusted reference clock signal is based on a received clock signal received from a second integrated circuit, and the data signal is based on a received data signal received from the second integrated circuit separately from the received clock signal.

* * * * *

UNITED STATES PATENT AND TRADEMARK OFFICE
CERTIFICATE OF CORRECTION

PATENT NO. : 7,545,190 B2 Page 1 of 1
APPLICATION NO. : 11/742845
DATED : June 9, 2009
INVENTOR(S) : Meei-Ling Chiang et al.

It is certified that error appears in the above-identified patent and that said Letters Patent is hereby corrected as shown below:

Col. 14, line 35, please replace "rang" with --range--

Signed and Sealed this

Fifteenth Day of September, 2009

David J. Kappos
*Director of the United States Patent and Trademark Office*